United States Patent [19]

Cates

[11] Patent Number: 4,725,987
[45] Date of Patent: Feb. 16, 1988

[54] ARCHITECTURE FOR A FAST FRAME STORE USING DYNAMIC RAMS

[75] Inventor: Billy E. Cates, Rochester, N.Y.

[73] Assignee: Eastman Kodak Company, Rochester, N.Y.

[21] Appl. No.: 790,691

[22] Filed: Oct. 23, 1985

[51] Int. Cl.⁴ .............................................. G11C 11/40
[52] U.S. Cl. ................................. 365/220; 365/222; 365/189; 364/200; 364/518
[58] Field of Search ....................... 364/200, 900, 518; 365/222, 219, 202, 189, 220

[56] References Cited

U.S. PATENT DOCUMENTS

| | | | |
|---|---|---|---|
| 3,905,023 | 9/1975 | Perpiglia | 364/200 |
| 4,079,462 | 3/1978 | Koo | 365/222 |
| 4,183,058 | 1/1980 | Taylor | 358/127 |
| 4,185,323 | 1/1980 | Johnson et al. | 365/222 |
| 4,241,425 | 12/1980 | Cenker et al. | 365/222 |
| 4,513,374 | 4/1985 | Hooks, Jr. | 364/200 |
| 4,616,310 | 10/1986 | Dill et al. | 364/200 |
| 4,636,942 | 1/1987 | Chen et al. | 364/200 |

OTHER PUBLICATIONS

IBM Technical Disclosure Bulletin, vol. 17, No. 3 (Aug. 1974).
J. Millman, Microelectronics-Digital and Analog Circuits and Systems, McGraw-Hill Book Company, pp. 286-297.

Primary Examiner—Gary V. Harkcom
Assistant Examiner—Randy W. Lacasse
Attorney, Agent, or Firm—Raymond L. Owens

[57] ABSTRACT

A fast frame store incorporating a memory array having selectable memory banks which include a plurality of relatively slow dynamic RAMs (DRAMs) is disclosed. The frame store has a buffered input and a buffered output to slow the data rate. Data can be read in parallel into a selected memory bank while at the same time other data are being read in parallel out of another selected memory bank. Refresh of DRAMs of an unselected bank occurs simultaneously with the transfer of data to or from the frame store. Several memory banks of the frame store are connected to a single row address select ($\overline{RAS}$) line, so that when a selected bank is being addressed for data transfer, the memory location of several other unselected banks are being refreshed.

3 Claims, 3 Drawing Figures

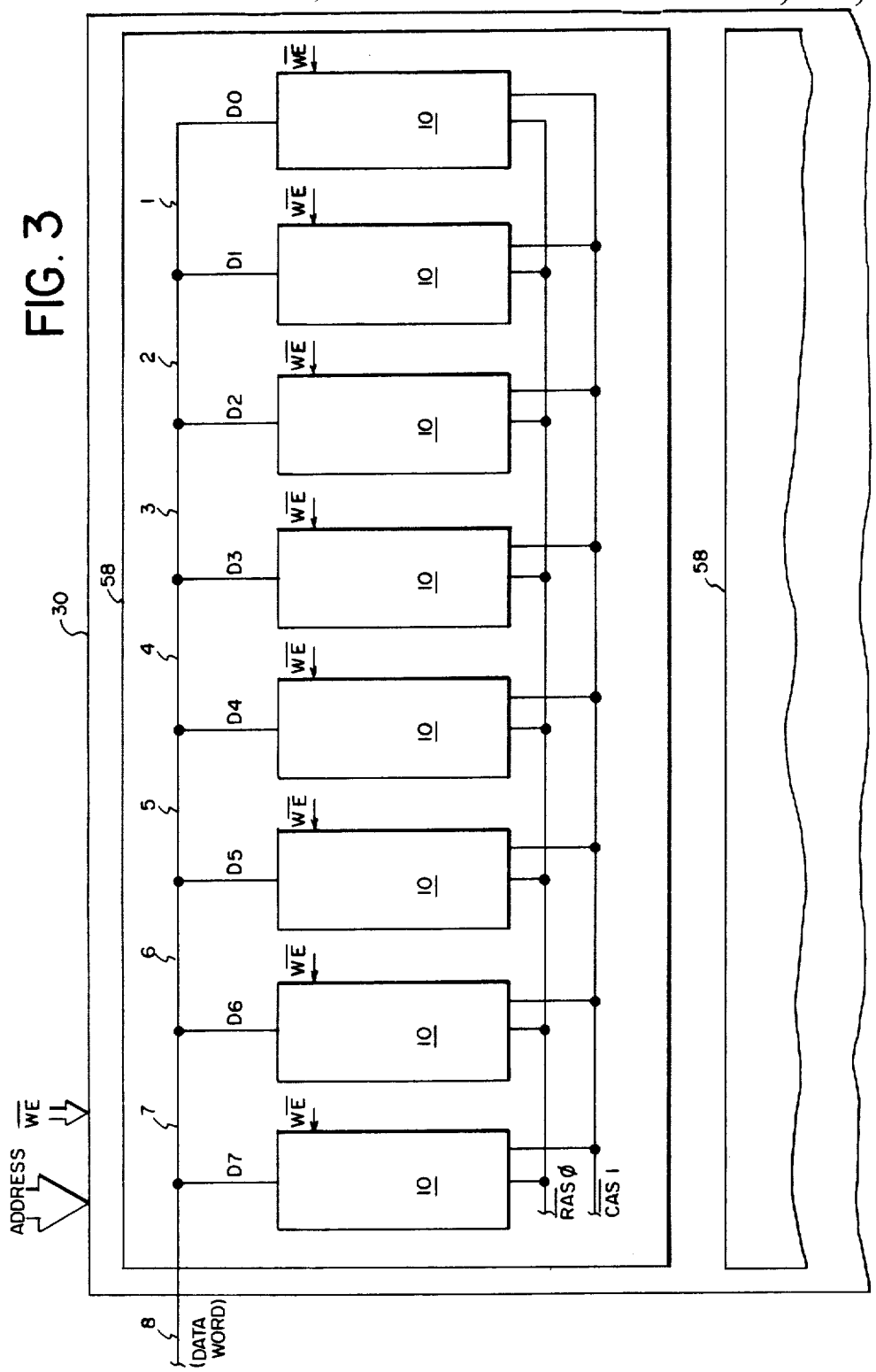

ARCHITECTURE FOR A FAST FRAME STORE USING DYNAMIC RAMS

BACKGROUND OF THE INVENTION

1. Field of the Invention

This invention relates to digital storage systems and more particularly to fast frame stores for storing digital images.

2. Description Relative to the Prior Art

A digital image processor can be used to improve the quality of a photographic image and typically includes a digitizer, a frame store, a processing section and an output device such as a printer. The digital image to be processed can be provided in a number of ways such as by scanning a beam of light through a photographic negative onto a photodetector. The output signal from the photodetector is digitized and stored in the frame store. The processing section performs the necessary image enhancement processing on the digitized image and the enhanced digital image is read out from the frame store and provided to a high speed "scan" printer.

Systems have been devised for scanning all of the pixels of the film negative quite rapidly, leading to the requirement for a frame store capable of handling data rates on the order of 15 MHz (70 ns/pixel) and having a memory capacity of a number of megabytes. A frame store capable of handling data at such rates can be constructed of random access memory (RAM) devices which are available to operate in static or dynamic modes. Each storage cell in a RAM (referred to as a memory cell) is fabricated with either a static storage cell or a dynamic storage cell. Static storage cells are fabricated with either bipolar or MOS components whereas dynamic storage cells are fabricated with MOS technology. A static RAM stores data in memory so long as the power is on whereas a dynamic RAM (DRAM) requires a refresh cycle.

Static RAMs are relatively expensive devices with limited storage capacity when compared with dynamic RAMs. MOS dynamic random access memory (DRAM) devices that are commercially available have many times the memory capacity of static RAMs and are less expensive. A memory cell in such a device usually includes a single MOS transistor and a charge storage capacitor (which can be provided by the substrate capacitance). Using DRAMs in the above-described frame store, instead of static RAMs, would significantly reduce the cost of the frame store while reducing the number of memory devices needed.

Problems are encountered when trying to implement the use of DRAM's in a frame store having high data rates. For example, the access time of a 64K DRAM is about to 300–500 ns while a frame store operating at 15 MHz requires a 50 to 70 ns memory access time. Access time is that duration needed to read a bit into or out of a memory cell. In addition to the problem of the slow DRAM access time, every memory cell in the DRAM must be refreshed within every four milliseconds due to the charge leakage in the storage capacitor in order to retain the data stored in the memory cells.

SUMMARY OF THE INVENTION

The object of the present invention is to use relatively slow DRAM's in a fast frame store.

This object is achieved by a frame store comprising a memory array having a plurality of selectable banks, each bank having a plurality of DRAMs; input and output data buffer means for respectively transferring data in parallel to and from bit cells of DRAMs of selected banks of the memory array; and controller means for selecting first and second banks and for controlling the transfer of data from said input buffer to said first selected bank while at the same time controlling the transfer of data from said second selected bank to said output buffer.

The frame store also includes means for causing the refresh of bit cells of DRAMs in at least one unselected bank simultaneous with the transfer of data to or from the selected memory bank.

BRIEF DESCRIPTION OF THE DRAWINGS

FIG. 3 is a schematic diagram of one section of a memory bank of the frame store in FIG. 2.

DETAILED DESCRIPTION OF THE PREFERRED EMBODIMENT

Figure 1:
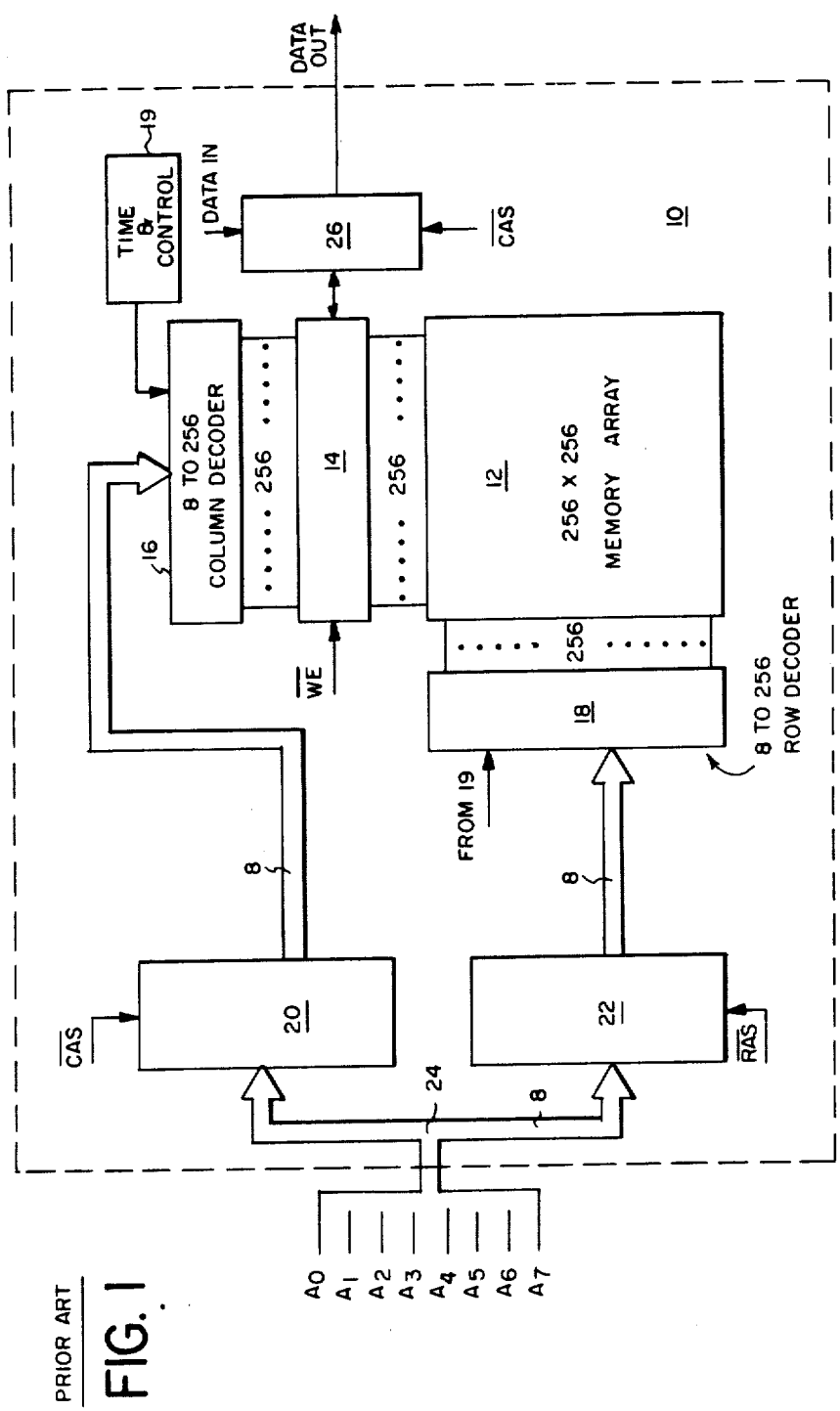
FIG. 1 is a block diagram of a conventional prior art 64K bit DRAM.

Referring now to FIG. 1, a block diagram of a conventional 64K × 1 bit DRAM 10 is shown. The DRAM 10 is composed of a 256 by 256 bit memory array 12 that is addressed by column decoder 16 and row decoder 18. The desired row and column addresses ($A_0$–$A_7$) are latched by column latch 20 and row latch 22 from the eight bit address bus 24 in response to two TTL strobe pulses, column address select ($\overline{CAS}$) and row address select ($\overline{RAS}$), both of which are active as low voltage level signals. In response to signals from timing and control 19, the column decoder 16 and the row decoder 18 select a particular column and row in each DRAM in the array 12. At the junction of the selected column and selected row is a selected bit cell which is to be read or written into depending upon the state of $\overline{WE}$. Data are read into or out of the memory array 12 through the sense and refresh amplifiers 14 in response to the write enable ($\overline{WE}$) strobe pulse. When the $\overline{WE}$ line is in a high logic level (high voltage), the DRAM 10 is in the read mode; when the $\overline{WE}$ line is in a low logic level, the DRAM 10 is in the write mode. In addition to latching the row address data, the $\overline{RAS}$ strobe causes all the non-addressed memory cells in the decoded row in array 12 whose row address is latched into the decoder 18 to be refreshed. The $\overline{CAS}$ signal when low, in addition to latching the column address data, is used as a chip select for the input and output data buffer 26. When the $\overline{CAS}$ signal is high, activating the $\overline{RAS}$ strobe (low level) refreshes all the memory cells of the addressed or decoded row of the bit array 12 without any data being exchanged because the output buffer 26 is in a high-impedance state. When the $\overline{CAS}$ signal is low, a bit cell is selected and data will be read into or out of that cell to and from buffer 26 depending on the level of the $\overline{WE}$ signal. All other bit cells of an addressed row will be refreshed. Strobing each of the 256 row addresses with a $\overline{RAS}$ strobe pulse, therefore causes all the bit cells of the memory array 12 to be refreshed.

Figure 2:
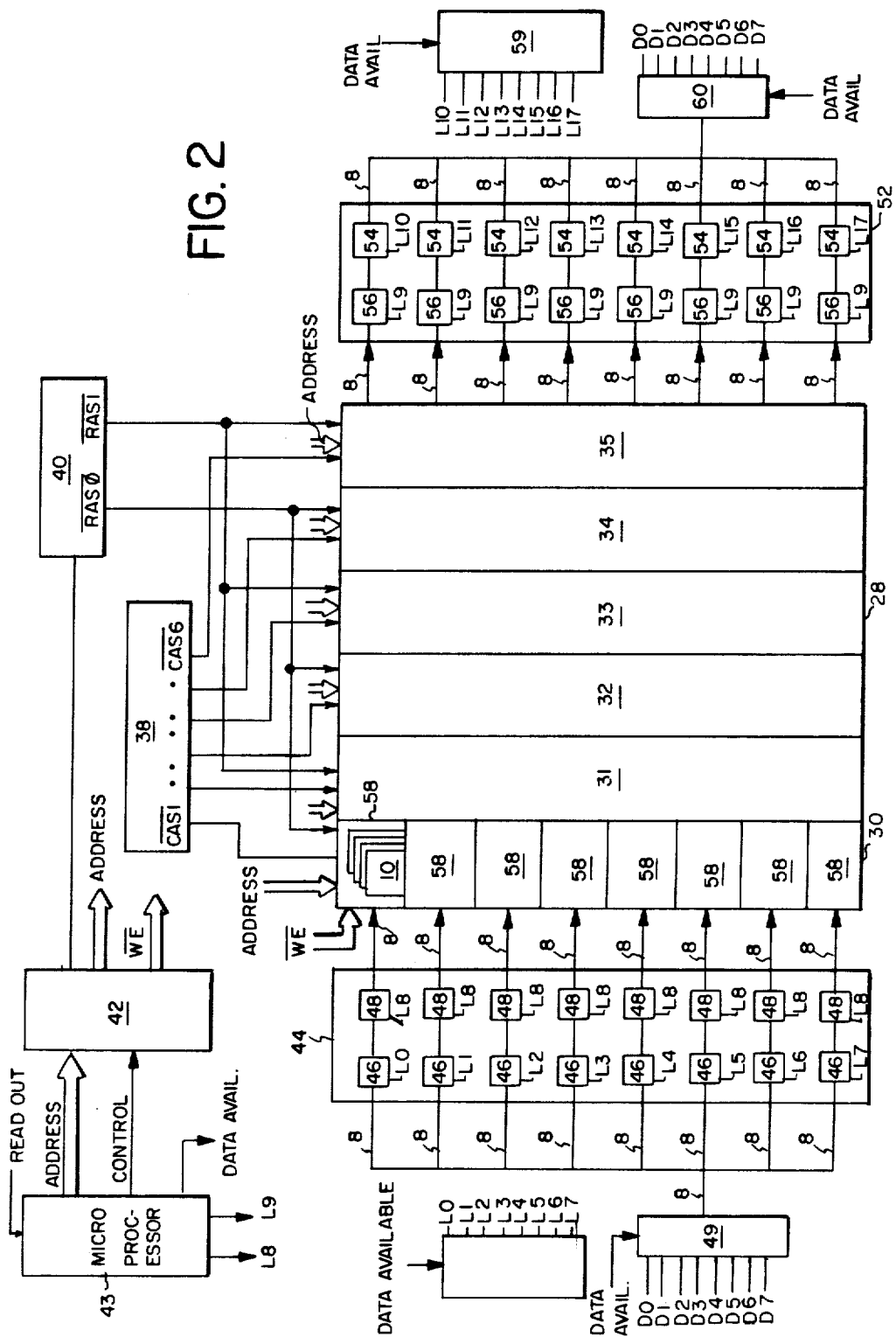
FIG. 2 is a block diagram of a frame store architecture in accordance with the invention.

Referring now to FIG. 2, a block diagram of a preferred frame store architecture is shown. A memory array 28 is laid out operationally into six memory banks 30–35 with sixty-four 64K × 1 bit DRAM's 10 in each memory bank. The six memory banks 30–35 are each connected to a separate column address select ($\overline{CAS}$)

line provided by the column address select circuitry 38. The even memory banks 30, 32 and 34 are connected to an $\overline{RAS0}$ select line and the odd memory banks 31, 33 and 35 are connected to an $\overline{RAS1}$ select line. The $\overline{RAS0}$ and $\overline{RAS1}$ voltage signals are generated by the row address select circuitry 40. The memory controller 42 provides the $\overline{WE}$ signals to each DRAM in memory. All the DRAMs in any given memory bank receive the identical $\overline{RAS}$, $\overline{CAS}$ and $\overline{WE}$ signals. In order to reduce delay times, the $\overline{CAS}$ and $\overline{RAS}$ signals are generated by utilizing fast TTL logic in the controllers 38 and 40.

Since each memory bank has a single column address select ($\overline{CAS}$) line to which all the DRAMs in the bank are connected, when the $\overline{CAS}$ line is low, the DRAMs of a selected bank can be either read from or written into depending upon the state of the $\overline{WE}$ signal. Alternate memory banks are connected to a common row address select ($\overline{RAS}$) line. A refresh cycle for an addressed row of a DRAM can be accomplished by activating (low level) the $\overline{RAS}$ line of a bank without activating the $\overline{CAS}$ line of such bank.

For example, if bank 31 is selected to be written into (read mode), $\overline{CAS2}$ is low and $\overline{WE}$ for bank 31 is high. The $\overline{RAS1}$ signal corresponding to bank 31 is low and strobes all of the other odd number memory banks (33, 35). At this time $\overline{CAS4}$ and $\overline{CAS6}$ are high and a "hidden" refresh of the addressed row of the DRAMs of the odd number memory banks 33 and 35 is therefore provided simultaneously with data transfer to bank 31. Let us assume that at the same time, bank 34 is also selected for data transfer (write mode) to buffer 52. In this instance $\overline{CAS5}$ is low and $\overline{WE}$ for bank 34 is low. Refresh of the addressed row of the DRAMs of the even number memory banks 30 and 32 is also accomplished if $\overline{CAS1}$ and $\overline{CAS3}$ are high.

Double buffering is accomplished by using an input buffer 44 and an output buffer 52. The input buffer 44 contains two sets of data latches, outer latches 46 and inner latches 48. Each set of latches has sixty-four gates. Since the basic memory cycle time (i.e. time required to store one data bit in one memory cell of a DRAM) is about 300 ns, it is impossible to directly store the data into memory at the desired data rates of approximately 70 ns/pixel. Incoming data words ($D_0$–$D_7$) are stored sequentially, one byte or word (eight bits) at a time in a logic circuit 49 in response to a data available signal provided by a microprocessor 43. Each byte of data is then latched into eight latches of the outer set of latches 46. In other words a group of eight outer latches 46 is selected by one of the signals $L_0$–$L_7$ to receive a byte of data. A binary counter 50 responds to a data available signal provided by microprocessor 43 sequentially provides the signals $L_0$–$L_7$. When all of the outer latches are full, eight bytes of data are loaded. These eight bytes of data are then parallel shifted to the inner latches 48 under the control of the signal $L_8$. Eight bytes of data are then shifted in parallel from the inner latches 48 to a selected memory bank of the memory array 28. It will take approximately 560 ns to refill the outer latches 46 with data providing sufficient time to transfer the eight data words or bytes from the inner latches 48 to the selected bank of the memory array 28. The output buffer 52 operates in a similar manner. The output buffer 52 has two sets of flip-flop latches 54 and 56, respectively. Eight bytes of data are read in parallel into the inner latches 56 in response to signals $L_9$. Eight bytes of data then are sequentially transferred to the outer latches 54 in response to signals $L_{10}$–$L_{17}$. Signals $L_{10}$–$L_{17}$ are sequentially produced by counter circuit 59 which responds to a data available signal provided by the microprocessor 43. Eight separate words or bytes of data ($D_0$–$D_7$) are read sequentially (one byte at a time) from the outer latches 54 into a storage device 60 while the inner latches 56 are being filled in parallel with eight new bytes of data from the memory array 28. Storage device 60 can be read out at the system rate. The use of the two sets of latches in both the input and output buffers permits slow DRAMS to be used in a fast frame store.

Reference will now be made to FIG. 3. As previously stated, each memory bank contains sixty-four 64K × 1 bit DRAM's 36. Each memory bank has eight sections 58. Each section 58 contains eight DRAM's. Each of these eight DRAMs receive one bit of data at a time. In other words, a section 58 is loaded with a byte of data. When eight bytes of data are shifted in parallel from the inner latches 48 to a selected memory bank (for example bank 30), each section 58 of the memory bank 30 receives one byte of data. As shown, each DRAM 10 of section 58 receives a single bit which is delivered to a bit cell having the same address in each DRAM. All the bit cells in the addressed row of every DRAM in the banks 32 and 34 of array 28 are at this time refreshed. Each memory section 58 holds 64K words or bytes and each memory bank holds 512K words or bytes. Because each memory request loads eight bytes or words in parallel, only 64K memory request are needed to completely load or unload a bank.

Each memory cell of every DRAM must be refreshed within four milliseconds or the stored bit of data will be lost due to leakage of the storage cell capacitor. Each memory transfer involves eight words; one word for each memory section 58. A separate memory request to each of the 256 different rows will cause a refresh of an entire memory bank. Furthermore, a memory data transfer operation to one selected bank will result in the refresh of all unselected memory banks commonly connected to the same $\overline{RAS}$ line. Because alternate banks are tied to the same $\overline{RAS}$ line, if 256 memory transfers are done in one odd bank, while at the same time 256 memory transfers are done in one even bank, the entire frame store will be refreshed.

The invention has been described in detail with reference to a preferred embodiment thereof, but it will be understood that variations and modifications can be effected within the spirit and scope of the invention. For example, 256K DRAMs or one megabit DRAMs could be used in accordance with the invention instead of the 64K bit DRAMs described above.

I claim:

1. A frame store apparatus for storing digital images formed from data words, each word having a predetermined number of data bits, said apparatus comprising:
    (a) memory means including at least four selectable memory banks, each bank having a plurality of memory sections, each section having a number of DRAMs equal to said predetermined number of data bits of a data word, each DRAM having refreshable bit cells;
    (b) input buffer means for receiving incoming data at a high system rate data and holding a predetermined number of data words and then transferring each such data word at a slower frame store rate in parallel to a particular one of said selected memory banks with each data bit being stored in one of the particular section's DRAMs;

(c) output buffer means effective while said input buffer means is transferring data to the particular memory bank for receiving data in parallel from the sections of another selected memory bank at the slower frame store rate and holding a predetermined number of data words and then transferring each such data word in parallel at the higher system rate; and (d) a single refresh circuit for causing the refresh of bit cells of a plurality of DRAMs in at least one unselected memory bank simultaneously with the transfer of data to or from selected memory banks.

2. The apparatus in claim 1 wherein said input means comprises a set of outer latches for receiving said data words sequentially and a set of inner latches for transferring said data words in parallel into a selected memory bank.

3. The apparatus in claim 2 wherein said output means comprises a set of inner data latches for receiving said data words in parallel from one of said memory banks and a set of outer data latches.

* * * * *